United States Patent [19]

Frühauf

[11] Patent Number: 4,626,790
[45] Date of Patent: Dec. 2, 1986

[54] DEMODULATOR FOR AMPLITUDE-MODULATED CARRIER FREQUENCY OSCILLATIONS

[75] Inventor: Waldemar Frühauf, Nuremberg, Fed. Rep. of Germany

[73] Assignee: Siemens Aktiengesellschaft, Berlin and Munich, Fed. Rep. of Germany

[21] Appl. No.: 721,976

[22] Filed: Apr. 10, 1985

[30] Foreign Application Priority Data

May 15, 1984 [DE] Fed. Rep. of Germany ....... 3418049

[51] Int. Cl.[4] .............................................. H03D 1/00
[52] U.S. Cl. .................................... 329/101; 329/168
[58] Field of Search ................... 329/101, 167, 168; 307/350, 354, 362, 363; 455/337

[56] References Cited

U.S. PATENT DOCUMENTS 4,229,668  10/1980  Ebihara et al. ..................... 307/304

FOREIGN PATENT DOCUMENTS 0092750  11/1983  European Pat. Off. .
0481977  11/1975  U.S.S.R. ............................. 329/168

OTHER PUBLICATIONS

*Electronic Design*, vol. 25, "Reduce System Noise with C-MOS Circuits", Dec. 6, 1973, pp. 112–115, Schamis.

*Primary Examiner*—Eugene R. LaRoche
*Assistant Examiner*—Robert J. Pascal
*Attorney, Agent, or Firm*—Thomas H. Jackson

[57] ABSTRACT

Amplitude-modulated carrier frequency oscillations are supplied to the demodulator of the present invention whose peak value is maintained constant on its receiving side by a controller. The carrier frequency oscillations are supplied via a capacitor to the two inputs of a NOR gate. Both inputs of the NOR gate are connected via a resistor with the output thereof. The output of the NOR gate is connected with an inverter, at whose output the evaluated carrier frequency oscillations in the form of data are collected. Because the different elements of C-MOS circuits inherently exhibit different threshold values, the comparator functions required for demodulation can be realized at little expense using the gates of a C-MOS circuit.

7 Claims, 9 Drawing Figures

DEMODULATOR FOR AMPLITUDE-MODULATED CARRIER FREQUENCY OSCILLATIONS

BACKGROUND OF THE INVENTION

1. Technical Field

The invention relates to a demodulator for amplitude-modulated carrier frequency oscillations whose peak value is maintained at a constant value on the receiving side by a controller.

2. Description of the Prior Art

In European Patent Office application No. 0092750 a system for the transmission of data telegrams in the form of digital signals is described. A carrier frequency is modulated with digital signals which can be transmitted, for example, via a current network. Each data telegram is thus formed by a coded sequence of carrier frequency pulses. The simplest way to evaluate the coded signal is by highly integrated C-MOS circuits, for which evaluation gate arrays can be used. Such circuits have only digital function elements. Demodulation of the digital signals, however, requires analog functions. The use of analog components in addition to the highly integrated C-MOS circuit involves considerable expense.

It is the object of the invention, therefore, to design a demodulator and decoder of the above-mentioned kind in such a way that its function can, to a large extent, be taken over entirely by the C-MOS circuit.

SUMMARY OF THE INVENTION

This problem is solved according to the present invention in that the carrier frequency oscillations are supplied via a capacitor to two inputs of a NOR gate. Both inputs of the NOR gate are connected via a resistor with the output thereof. The output of the NOR gate is connected with an inverter such that the evaluated carrier frequency oscillations are picked off at the output of the inverter.

The NOR gate constitutes a symmetrizing amplifier stage which gives the carrier frequency oscillations a defined center potential. The center potential is higher than one half the amplitude of the carrier frequency oscillations. Thus the total carrier frequency signal always remains positive, as is required for processing in C-MOS circuits. The inverter after the NOR gate acts as a comparator, which on the output side delivers a signal only when its output signal exceeds a fixed level.

In one embodiment of the present invention, the output of the NOR gate is connected with two inputs of a NAND gate, the output of which is connected to a reference potential via a resistor and a capacitor. The control deviation of the peak value of the carrier frequency oscillations present at the capacitor are supplied to an input controller. An additional voltage comparison can thus be carried out with a gate of the C-MOS circuit, the desired amplitude for the carrier frequency oscillations being given by this gate.

In another embodiment, there is connected between the NAND gate and the resistor suggested in the preceeding paragraph a P-MOS transistor whose gate is connected to the output of the NAND gate and whose drain-source path lies between a supply voltage and the resistor. With this P-MOS transistor the output signal of the NAND gate is amplified and moreover inverted, as is generally necessary for the operation of the controller if the final control element requires a positive voltage for amplitude attenuation.

Furthermore, the output of the NOR gate may be connected with both inputs of an additional NOR gate, at the output of which the carrier frequency oscillations are picked off as square wave signals. Thus it is possible to evaluate also carrier frequency signals which contain a frequency modulation in addition to amplitude modulation.

In an alternative embodiment, the carrier frequency oscillations may be supplied via a capacitor to two inputs of a NAND gate, both inputs of the NAND gate being connected via a resistor with the output thereof. The output of the NAND gate is connected with an inverter, and the evaluated carrier frequency oscillations are picked off at the output of the inverter. In such a demodulator, too, a symmetrization of the carrier frequency oscillations to a defined center potential and a comparison with a threshold value by the inverter acting as a comparator take place. As compared with the previously mentioned design, only the output signal is inverted.

Accordingly, to determine the peak value of the carrier frequency oscillations, the output of the NAND gate is appropriately connected with two inputs of a NOR gate, the output of which is connected to a reference potential via a resistor and a capacitor, the control deviation of the amplitude of the digital signal present at the capacitor being supplied to the controller.

To evaluate the frequency of the carrier frequency oscillations, advantageously the ouput of the NAND gate is connected to both inputs of an additional NAND gate, at the output of which the carrier frequency oscillations are picked off as square wave signals.

In the following, the embodiment of the invention is explained in greater detail with reference to FIGS. 1 to 9.

DETAILED DESCRIPTION

Figure 1:
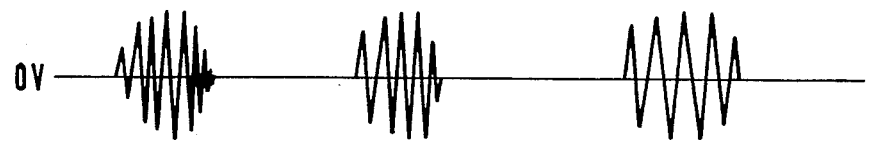
FIG. 1 is a representation of a modulated data signal.
Figure 2:
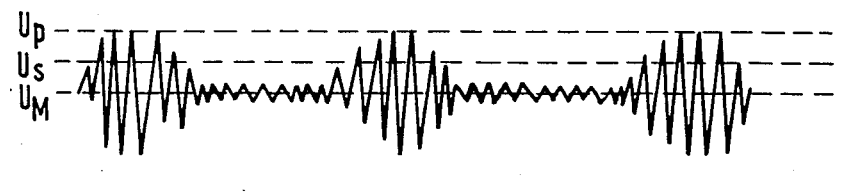
FIG. 2 is a representation of the data signal of FIG. 1 having undergone symmetrization.
Figure 3:
FIG. 3 is a representation of the extraction of data at the output of inverter 9 of FIG. 5 from the symmetrized signal of FIG. 2.

FIG. 1 shows, as an example, a data telegram composed of individual carrier frequency signals. Each carrier frequency signal consists of a plurality of oscillations of a carrier frequency. It is the function of a demodulator, among others, to give a defined center potential to the signal transmitted direct current potential-free by a capacitor. As C-MOS circuits can process only positive voltages, the center potential $U_M$ must be situated so that the signal always remains positive. The corresponding symmetrized signal is illustrated in FIG. 2. Also, for further evaluation the signal must have a constant peak voltage $U_P$. Lastly, it must be compared with a threshold value $U_S$, being evaluated as a "One" signal when the threshold value $U_S$ should lie approximately in the middle between the peak voltage $U_P$ and the center potential $U_M$. The above-mentioned functions of the demodulator actually presupposes analog components, usually comparators.

Figure 5:
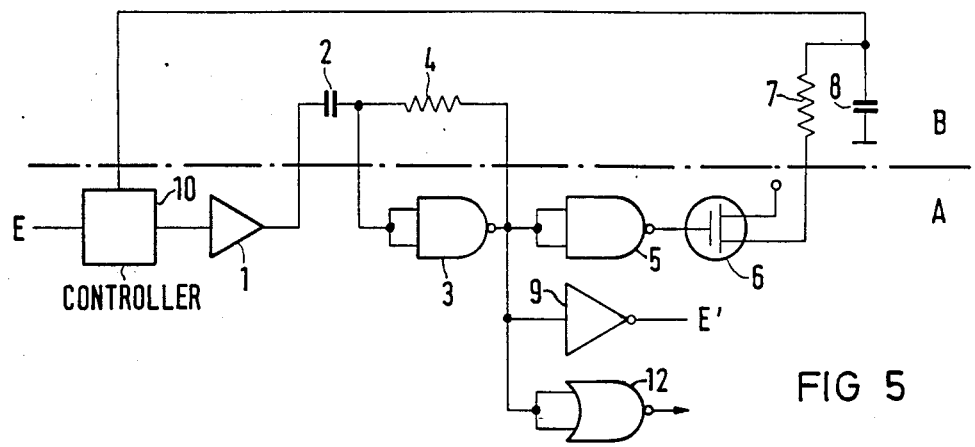
FIG. 5 is a schematic diagram of one embodiment of the present invention.

In FIG. 5 is shown a circuit in which the mentioned analog functions can be constructed with the aid of gates and can therefore be realized to a large extent with a C-MOS circuit. In addition to the C-MOS circuit only two resistors and two capacitors are required. In FIG. 5, the elements contained in the C-MOS circuit are entered in a region A, the other elements in a region B. The input signal E is supplied to the two inputs of a NOR gate 3 via a controller 10, a preamplifier 1 and a capacitor 2. The two inputs of the NOR gate 3 are connected with its output via a resistor 4. The output of the NOR gate 3 is connected in addition to other gates with an inverter 9, at the output of which the demodulated signal E' is present. The output of NOR gate 3 is further connected with both inputs of a NAND gate 5, which is followed on the output side by the gate of a P-MOS transistor 6. The drain connection of the P-MOS transistor 6 is applied to a supply voltage, not shown, and the source connection to the reference potential via a resistor 7 and a capacitor 8. The junction of resistor 7 and capacitor 8 is connected with an input of controller 10. All structural elements shown with the exception of the capacitors 2 and 8 and the resistors 4 and 7 constitute parts of a C-MOS circuit.

Figure 6:
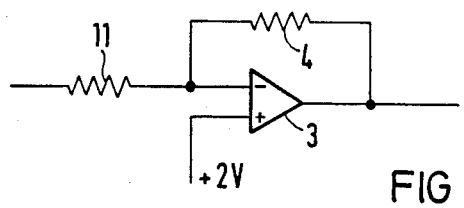
FIG. 6 is a detailed equivalent circuit diagram for NOR gate 3 of FIG. 5.

In the circuit shown, a defined center potential a 2 V is impressed on the signal by means of the feedback NOR gate 3 via a resistor 4. As an explanation, an equivalent circuit diagram for the feedback NOR gate 3 is shown in FIG. 6. It behaves like a feedback operational amplifier to which a signal is supplied at the inverting output. The NOR gate 3 further has a threshold voltage which, for C-MOS gates with two inputs, is typically 2 V. The effect is as if the non-inverting input of an operational amplifier were wired with a voltage of 2 V. The resistor 11 shown in the equivalent circuit diagram may be formed by resistances inherent in the C-MOS circuit.

The input signal having thus been symmetrized with the feedback NOR gate 3 to a center potential $U_M$ of about 2 V, it is supplied to the two inputs of a NAND gate 5. In C-MOS technology, NAND gates with two inputs typically have a threshold voltage 3 V. Therefore, together with the connected P-MOS transistor 6, resistor 7 and capacitor 8, the NAND gate 5 produces a threshold value $U_P$ of about 3 V for the peak value of the signal voltage. At capacitor 8, therefore, a control deviation for the peak regulation is available, which is supplied to the controller 10.

Lastly the additional threshold value, designated by $U_S$ in FIG. 2, for the evaluation of the signal is realized with the inverter 9. In C-MOS technology, inverters typically have a threshold voltage of 2.5 V. Hence a signal is available at the output of inverter 9 only when the input signal exceeds this level. The threshold voltage $U_S$ of 2.5 V lies—as desired—in the middle between the center potential $U_M$ of 2 V and the threshold value $U_P$ of 3 V for the peak voltage.

Figure 4:
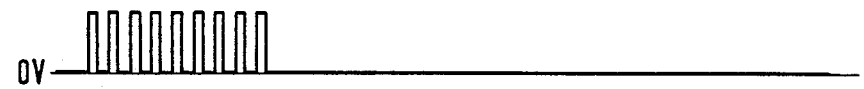
FIG. 4 is a representation of the transformations performed by NOR gate 12 of FIG. 5.

If the carrier frequency oscillations have not only an amplitude modulation but also a frequency modulation, it is desirable for the demodulation if the carrier frequency oscillations are available as square wave signals. This is achieved by following the NOR gate 3 with an additional NOR gate 12 according to FIG. 5. Its threshold value is almost identical with the threshold value $U_M$ of the NOR gate 3. The carrier frequency oscillations always present at small amplitude are therefore transformed with NOR gate 12 into the square oscillations shown in FIG. 4. Hence a phase locked loop circuit for example can control the demodulation process.

With the circuit according to the invention, therefore, the actually analog functions of a demodulator can be realized with the gates of a C-MOS circuit. To accomplish this, the fact that the gates inherently have different threshold values is utilized. The typical values for NAND gates with two inputs are 3 V, for NOR gates with two inputs 2 V, and for inverters, 2.5 V. These values can be obtained, for example, from the publication "C MOS Design Manual" on the firm Interdesign (Ferranti), at pages 431, 432 or in similar C-MOS design publications. While for different circuits, these threshold values are subject to strong variations, their ratios within a single circuit are typically constant. What is important for the demodulator function, then, is not so much the absolute values of the threshold levels but primarily their relation to each other.

Figure 8:
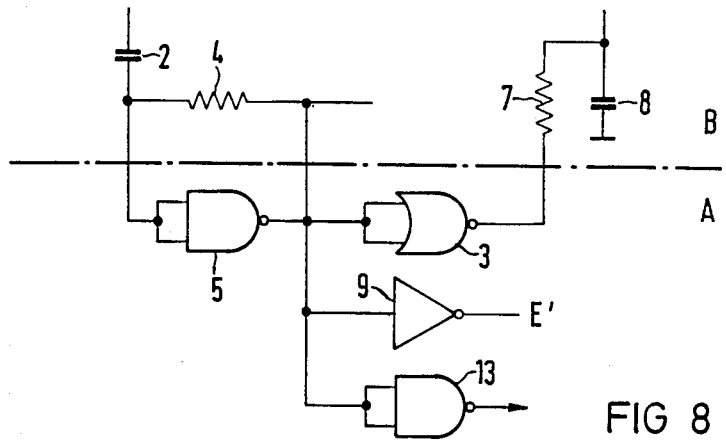
FIG. 8 is a schematic diagram of one embodiment of the present invention for performing symmetrization in accordance with FIG. 7.
Figure 7:
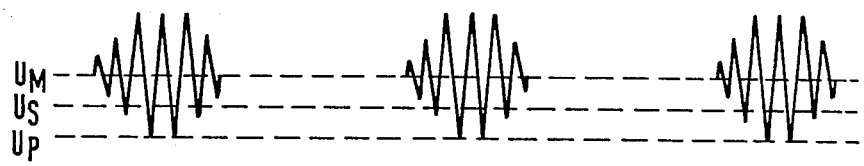
FIG. 7 is a representation of a symmetrized data signal where the minimum signal values are regarded.
Figure 9:
FIG. 9 is a representation of the output of inverter 9 of FIG. 8.

The inventive idea can be realized in a similar manner by interchanging according to FIG. 7 the threshold values $U_M$ for the center potential and $U_P$ for the peak voltage. Peak voltate $U_P$ will then be, for example, 2 V, $U_M$ 3 V, and the threshold value $U_S$ for evaluation of the signal 2.5 V, that is, in the center between $U_M$ and $U_P$. Such a circuit is shown in FIG. 8. Compared with the circuit according to FIG. 5, the NOR gate 3 and NAND gate 5 are interchanged. The input signal is supplied to the NAND gate 5 in feedback via a resistor 4, followed on the output side by the two inputs of the NOR gate 3. In like manner the NAND gate 5 is followed by the inverter 9. Compared with the circuit according to FIG. 5, simply the output signals of the inverter 9 and of the NOR gate 3 are inverted. If the voltage magnitude of the carrier frequency oscillations becomes greater than 0.5 V, the threshold value $U_S$ is fallen short of. This causes the output voltage of inverter 9 to go to "Zero", as shown in FIG. 9, while normally it is "One". Likewise the output voltage of the NOR gate 3 goes to zero when the peak value of the voltage of the carrier frequency oscillations exceeds the desired value, being thus below peak voltage $U_P$. If the controller 10 (not shown in FIG. 8) requires a positive voltage for amplitude attenuation, then inversion is no longer necessary after the NOR gate. For the derivation of square oscillations of equal frequency with the carrier frequency oscillations, a second NAND gate 13 can be made to follow the NAND gate 5. As in the circuit arrangement in FIG. 5, there is thus formed a threshold voltage which is almost identical with the center potential $U_M$ so that also carrier frequency oscillations of small amplitude can be transformed into square pulses.

What is claimed is:

1. A demodulator for amplitude-modulated carrier frequency oscillations whose peak value is maintained at a constant value at its receiving side by a controller, wherein the carrier frequency oscillations are supplied via a first capacitor to two inputs of a NOR gate, both inputs of the NOR gate being connected via a first resistor with the output thereof, and the output of the NOR gate being connected to an inverter, such that, at the output of the inverter, the evaluated carrier frequency oscillations are collected.

2. A demodulator according to claim 1, wherein the output of the NOR gate is connected with two inputs of a NAND gate whose output is connected to a reference potential via a second resistor and a second capacitor, such that the control deviation of the peak value of the carrier frequency oscillations present at the second capacitor is supplied to the controller.

3. A demodulator according to claim 2, comprising a P-MOS transistor connected between the NAND gate and the resistor, the gate of which is connected with the second output of the NAND gate and whose drain-source path lies between a supply voltage and the second resistor.

4. A demodulator according to claim 1, the output of the NOR gate of which is connected with both inputs of an additional NOR gate, at whose output the carrier frequency oscillations are collected as square wave signals.

5. A demodulator for amplitude-modulated carrier frequency oscillations whose peak value is maintained at a constant value on its receiving side by a controller, wherein the carrier frequency oscillations are supplied via a first capacitor to two inputs of a NAND gate, both inputs of the NAND gate being connected via a first resistor to the output thereof and the output of the NAND gate being connected with an inverter such that at the output of the inverter the evaluated carrier frequency oscillations are collected.

6. A demodulator according to claim 5, the output of the NAND gate of which is connected with two inputs of a NOR gate whose output is connected with a reference potential via a second resistor and a second capacitor such that the control deviation of the amplitude of the digital signal present at the second capacitor is supplied to the controller.

7. A demodulator according to claim 5, the output of the NAND gate of which is connected with both inputs of an additional NAND gate at whose output the carrier frequencey oscillations are picked off as square wave signals.

* * * * *